US011790131B2

(12) United States Patent
Liu et al.

(10) Patent No.: US 11,790,131 B2
(45) Date of Patent: *Oct. 17, 2023

(54) SIMULATIONS WITH MODIFIED AGENTS FOR TESTING AUTONOMOUS VEHICLE SOFTWARE (71) Applicant: Waymo LLC, Mountain View, CA (US)

(72) Inventors: Xiaoyi Liu, Mountain View, CA (US); Menghui Wang, Santa Clara, CA (US); Yang-hua Chu, Menlo Park, CA (US); Aleksandar Gabrovski, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/947,518

(22) Filed: Sep. 19, 2022

(65) Prior Publication Data
US 2023/0071259 A1    Mar. 9, 2023

Related U.S. Application Data (63) Continuation of application No. 16/697,428, filed on Nov. 27, 2019, now Pat. No. 11,494,533.

(51) Int. Cl.
G06F 30/20 (2020.01)
G05D 1/00 (2006.01)

(52) U.S. Cl.
CPC ........... *G06F 30/20* (2020.01); *G05D 1/0088* (2013.01); *G05D 2201/0213* (2013.01)

(58) Field of Classification Search
CPC .................. G06F 30/20; G05D 1/0088; G05D 2201/0213
(Continued)

(56) References Cited

U.S. PATENT DOCUMENTS 9,365,155 B2 * 6/2016 Hathaway ................. G01S 7/10
9,483,948 B1 * 11/2016 Gordon ................. B60W 30/00
(Continued)

OTHER PUBLICATIONS

Sippl et al. (From Simulation Data to Test Cases for Fully Automated Driving and ADAS, 2017, ICTSS, pp. 1-16) (Year: 2017).*
(Continued)

*Primary Examiner* — Iftekhar A Khan
(74) *Attorney, Agent, or Firm* — Botos Churchill IP Law (57) ABSTRACT The disclosure relates to testing software for operating an autonomous vehicle. In one instance, a simulation may be run using log data collected by a vehicle operating in an autonomous driving mode. The simulation may be run using the software to control a simulated vehicle and by modifying a characteristic of an agent identified in the log data. During the running of the simulation, that a first type of interaction between the first simulated vehicle and the modified agent will occur may be determined. In response to determining that the particular type of interaction will occur, the modified agent may be replaced by a interactive agent that simulates a road user corresponding to the modified agent that is capable of responding to actions performed by simulated vehicles. That the particular type of interaction between the simulated vehicle and the interactive agent has occurred in the simulation may be determined.

20 Claims, 9 Drawing Sheets (58) Field of Classification Search
USPC .......................................................... 703/8
See application file for complete search history.

(56) References Cited

U.S. PATENT DOCUMENTS

| | | | | |
|---|---|---|---|---|
| 9,612,123 | B1* | 4/2017 | Levinson | B60Q 9/008 |
| 9,975,483 | B1* | 5/2018 | Ramaswamy | B60Q 11/00 |
| 10,324,463 | B1* | 6/2019 | Konrardy | G05D 1/0278 |
| 10,346,564 | B2* | 7/2019 | Kim | G06F 11/3696 |
| 10,482,003 | B1* | 11/2019 | Bonder | G06F 11/3684 |
| 10,740,988 | B2* | 8/2020 | Liu | G05D 1/005 |
| 10,795,804 | B1* | 10/2020 | Nygaard | G06F 11/3688 |
| 11,034,348 | B2* | 6/2021 | Ding | G05D 1/0214 |
| 11,048,832 | B2* | 6/2021 | Alvarez | G06F 30/15 |
| 11,126,763 | B1* | 9/2021 | Gabrovski | G05D 1/0088 |
| 11,391,587 | B1* | 7/2022 | Joshi | G01C 21/3492 |
| 2010/0104199 | A1* | 4/2010 | Zhang | G06V 20/588 |
| | | | | 382/199 |
| 2013/0054106 | A1* | 2/2013 | Schmudderich | G01S 13/931 |
| | | | | 701/1 |
| 2015/0064658 | A1* | 3/2015 | Hales | G09B 9/02 |
| | | | | 434/30 |
| 2016/0082953 | A1* | 3/2016 | Teller | B60W 30/08 |
| | | | | 701/23 |
| 2017/0286570 | A1* | 10/2017 | Kim | G06F 11/3688 |
| 2017/0369062 | A1* | 12/2017 | Saigusa | B60W 50/04 |
| 2018/0024553 | A1* | 1/2018 | Kong | B60W 30/0953 |
| | | | | 701/26 |
| 2018/0075309 | A1* | 3/2018 | Sathyanarayana | G05D 1/0055 |
| 2018/0349547 | A1* | 12/2018 | Sun | G06F 9/46 |
| 2019/0025843 | A1* | 1/2019 | Wilkinson | G05D 1/0088 |
| 2019/0042679 | A1* | 2/2019 | Stefan | G06F 30/20 |
| 2019/0049970 | A1* | 2/2019 | Djuric | B60W 60/00276 |
| 2019/0072973 | A1* | 3/2019 | Sun | B62D 15/0255 |
| 2019/0118805 | A1* | 4/2019 | Lim | G07C 5/008 |
| 2019/0129831 | A1* | 5/2019 | Goldberg | G06F 3/04847 |
| 2019/0213103 | A1* | 7/2019 | Morley | G06F 11/3608 |
| 2019/0228571 | A1* | 7/2019 | Atsmon | G01C 21/3815 |
| 2019/0235499 | A1* | 8/2019 | Kazemi | G01S 17/931 |
| 2019/0235521 | A1* | 8/2019 | Mudalige | G05D 1/0248 |
| 2019/0278698 | A1* | 9/2019 | Ahner | G05D 1/0088 |
| 2021/0078600 | A1* | 3/2021 | Price | G08G 1/16 |
| 2021/0157882 | A1* | 5/2021 | Liu | G06F 11/3684 |
| 2021/0181738 | A1* | 6/2021 | Jiang | B60W 30/02 |
| 2021/0387628 | A1* | 12/2021 | Wang | B60W 30/18163 |
| 2021/0390225 | A1* | 12/2021 | Yu | G06F 30/15 |

OTHER PUBLICATIONS

Torabi et al. (An Agent-Based Micro-Simulator for ITS, 2018, ITSC, pp. 2556-2561) (Year: 2018).*
Tuncali et al. (Simulation-based Adversarial Test Generation for Autonomous Vehicles with Machine Learning Components, 2018, IEEE, pp. 1-18) (Year: 2018).*
International Search Report and Written Opinion for Application No. PCTUS2061816 dated Mar. 5, 2021.
Kim, Baekgyu et al., "Testing Autonomous Vehicle Software in the Virtual Prototyping Environment", IEEE Embedded Systems Letters, Mar. 2017, pp. 5-8, vol. 9, No. 1.

* cited by examiner

SIMULATIONS WITH MODIFIED AGENTS FOR TESTING AUTONOMOUS VEHICLE SOFTWARE

CROSS REFERENCE TO RELATED APPLICATIONS

The present application is a continuation of U.S. patent application Ser. No. 16/697,428, filed Nov. 27, 2019, the entire disclosure of which is incorporated herein by reference.

BACKGROUND

Autonomous vehicles, for instance, vehicles that do not require a human driver, can be used to aid in the transport of passengers or items from one location to another. Such vehicles may operate in a fully autonomous mode where passengers may provide some initial input, such as a pickup or destination location, and the vehicle maneuvers itself to that location, for instance, by determining and following a route which may require the vehicle to respond to and interact with other road users such as vehicles, pedestrians, bicyclists, etc. It is critical that the autonomous control software used by these vehicles to operate in the autonomous mode is tested and validated before such software is actually used to control the vehicles in areas where the vehicles are interacting with other objects.

BRIEF SUMMARY

One aspect of the disclosure provides a method of testing software for operating a vehicle in an autonomous driving mode. The method includes running, by one or more processors, a simulation by modifying a characteristic of an agent identified in the log data and by using log data collected by a vehicle operating in an autonomous driving mode, wherein the simulation is run using the software to control a simulated vehicle; during the running of the simulation, determine, by the one or more processors, that a first type of interaction between the first simulated vehicle and the modified agent will occur; in response to determining that the first particular type of interaction between the simulated vehicle and the modified agent will occur, replacing, by the one or more processors, the modified agent with an interactive agent that simulates a road user corresponding to the modified agent that is capable of responding to actions performed by simulated vehicles; and determining, by the one or more processors, that a second particular type of interaction between the simulated vehicle and the interactive agent has occurred in the simulation.

In one example, the first particular type of interaction is a collision. In this example, the second particular type of interaction is a collision, and the method further comprises, in response to determining that a collision between the simulated vehicle and the interactive agent has occurred, flagging the simulation for further review. Alternatively, the second particular type of interaction is one of the simulated vehicle or the interactive agent swerving, and the method further comprises, in response to determining that a collision between the simulated vehicle and the model agent has occurred, flagging the simulation for further review. Alternatively, the second particular type of interaction is one of the simulated vehicle or the interactive agent decelerating at a particular rate, and the method further comprises, in response to determining that a collision between the simulated vehicle and the interactive agent has occurred, flagging the simulation for further review. In another example, the method also includes identifying the log data by analyzing various log data to identify a situation in which an autonomous vehicle is exhibiting a first type of behavior and the agent is exhibiting a second type of behavior. In this example, the first type of behavior is changing lanes, and the second type of behavior is passing the autonomous vehicle. Alternatively, the first type of behavior is making an unprotected turn, and the second type of behavior is exceeding a speed limit for the agent while approaching the autonomous vehicle from an oncoming lane. In another example, the characteristic includes a dimension of the agent. In another example, the characteristic includes a shape of the agent. In another example, the agent is a first type of road user, and modifying the agent causes the modified agent to appear to the software to be a second type of road user different from the first type of road user. In this example, the first type of road user is a car, and the second type of road user is a motorcycle. Alternatively, the first type of road user is a car, and the second type of road user is a truck having particular characteristics. Alternatively, the first type of road user is a pedestrian, and the second type of road user is a bicyclist. Alternatively, the first type of road user is a pedestrian, and the second type of road user is an animal. Alternatively, the first type of road user is a bicyclist, and the second type of road user is a scooter rider. Alternatively, the first type of road user is a pedestrian with a shopping cart, and the second type of road user is a pedestrian with a stroller.

DETAILED DESCRIPTION

Overview

The technology relates to evaluating interactions in log-based simulations using software for vehicles operating autonomously. The log-based simulations correspond to simulations which are run using log data collected by a vehicle operating in an autonomous mode over some brief period of time such as 1 minute or more or less. The log data may include information from the vehicle's various systems including perception, routing, planning, positioning, etc. At the same time, the actual vehicle is replaced with a simulated vehicle which can make decisions using software for controlling the vehicle autonomously. By doing so, the software can be rigorously tested. For instance, the simulations may be used to determine whether a particular type of event or interaction with another agent has occurred, such as a particular type of behavior, collision, or near collision As an example, these events and interactions may be used for various purposes, such as determining whether the software can "pass" a given simulation without a collision or near collision and to pinpoint the types of behaviors and/or software modules that may been attention in order to improve performance and safety, without requiring a vehicle to physically drive "real" miles or having to "manufacture" situations in the real world.

However, when running simulations using log data, there may be a limited number of situations having certain characteristics. For instance, there may be a need to test the software in "outlier" cases for which there may be very few examples. As an example, testing software in situations with specific types of road users, such as motorcyclists, may be difficult as there may be very few examples of motorcycles near a vehicle that recorded the log data. Because of this, certain behaviors that the software may be capable of causing a vehicle to perform, such as changing lanes or merging near, may not be sufficiently tested in order to confidently use these behaviors near a motorcycle. As a result, validating the safety and effectiveness of the vehicle's software for such situations may be very difficult. To address these issues, when running simulations, more common road users or agents may be replaced by less common road users.

In order to identify relevant log data, the log data may be analyzed to identify situations in which the autonomous vehicle is exhibiting one or more specific types of behaviors and another agent is exhibiting one or more specific types of behaviors. Using the identified log data, a simulation may be run. In this simulation, the agent that is attempting the specific type of behavior for which the log data was identified may be modified in order to provide a modified simulation.

During the modified simulation, the system may determine whether there would be a trigger for replacement of the modified agent. A trigger for replacement of the modified agent may include a certain type of interaction between the simulated vehicle and the modified agent. If not, the simulation would be run without replacing the modified agent with an interactive agent. If so, the modified agent may be replaced with an agent that has some responsive capabilities. As such, the interactive agent may be able to respond to the autonomous vehicle's behavior in the modified simulation.

The modified simulation may be analyzed to identify particular types of interactions with other agents such as collisions or near collisions between the simulated vehicle and the interactive agent. If there are no collisions or near collisions, the software may be considered to have "passed" the modified simulation or may be considered to be validated for that specific modified simulation. If a collision or near collision with an agent is identified, the modified simulation may be annotated or flagged for additional consideration, etc. The simulation may be analyzed to review metrics other than collision data, such as comfort, stranding, safety risk, etc. in order to evaluate the software.

The features described herein may provide for a safe, effective, and realistic way of testing software for autonomous vehicles in order to identify potential critical bugs with the software for outlier situations. For instance, the software can be tested in hundreds of thousands of situations based on actual sensor data using modified agents. In addition, those simulations that are annotated or flagged may be more critically important to determining how to revise or update the software being tested. Further, by adding interactive agents, "new" simulations can be created which allow for analysis of a plurality of potential safety issues without requiring new log data for such simulations. Other benefits may include the ability of a software developer to experiment with behavior changes and use this to display lots of realistic examples of how their change plays out. This could allow for much faster feature development, since the alternatives would involve the developer sifting through lots of spurious failures themselves, waiting for an operator to do the same, or to drive a real vehicle around with the behavior change to log real responses.

Example Systems

Figure 1:
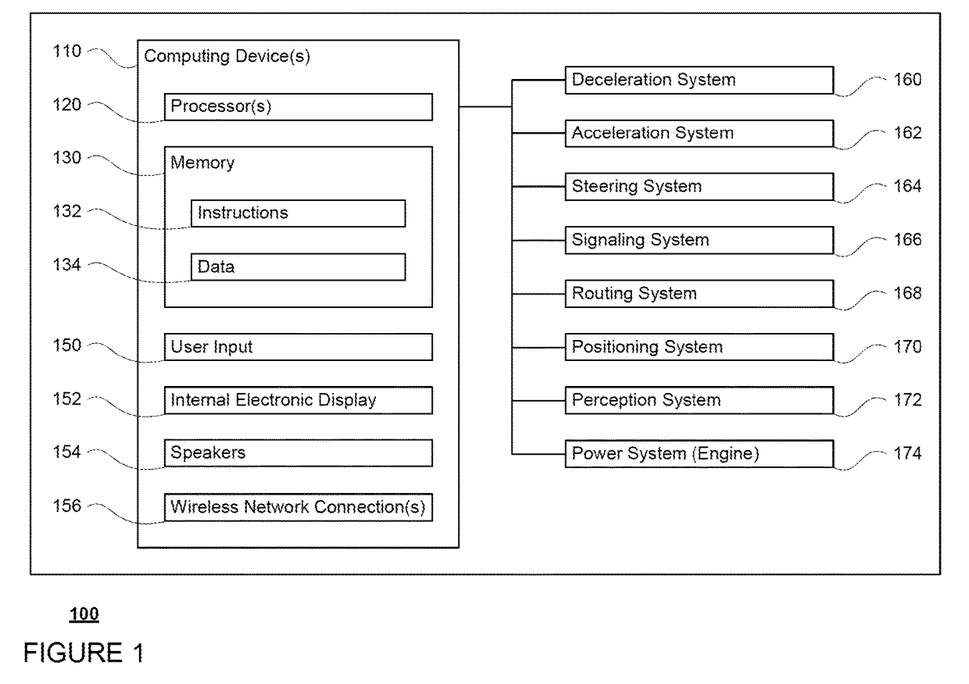
FIG. 1 is a functional diagram of an example vehicle in accordance with an exemplary embodiment.

As shown in FIG. 1, a vehicle 100 in accordance with one aspect of the disclosure includes various components. While certain aspects of the disclosure are particularly useful in connection with specific types of vehicles, the vehicle may be any type of vehicle including, but not limited to, cars, trucks, motorcycles, buses, recreational vehicles, etc. The vehicle may have one or more computing devices, such as computing devices 110 containing one or more processors 120, memory 130 and other components typically present in general purpose computing devices.

The memory 130 stores information accessible by the one or more processors 120, including instructions 134 and data 132 that may be executed or otherwise used by the processor 120. The memory 130 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 134 may be any set of instructions to be executed directly (such as machine code) or indirectly (such as scripts) by the processor. For example, the instructions may be stored as computing device code on the computing device-readable medium. In that regard, the terms "software," "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 132 may be retrieved, stored or modified by processor 120 in accordance with the instructions 134. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processors 120 may be any conventional processors, such as commercially available CPUs. Alternatively, the one or more processors may be a dedicated device such as an ASIC or other hardware-based processor. Although FIG. 1 functionally illustrates the processor, memory, and other elements of computing devices 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing devices 110.

Accordingly, references to a processor or computing device will be understood to include references to a collection of processors or computing devices or memories that may or may not operate in parallel.

Computing devices 110 may all of the components normally used in connection with a computing device such as the processor and memory described above as well as a user input 150 (e.g., a mouse, keyboard, touch screen and/or microphone) and various electronic displays (e.g., a monitor having a screen or any other electrical device that is operable to display information). In this example, the vehicle includes an internal electronic display 152 as well as one or more speakers 154 to provide information or audio visual experiences. In this regard, internal electronic display 152 may be located within a cabin of vehicle 100 and may be used by computing devices 110 to provide information to passengers within the vehicle 100.

Computing devices 110 may also include one or more wireless network connections 156 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

In one example, computing devices 110 may be control computing devices of an autonomous driving computing system or incorporated into vehicle 100. The autonomous driving computing system may capable of communicating with various components of the vehicle in order to control the movement of vehicle 100 according to the autonomous control software of memory 130 as discussed further below. For example, returning to FIG. 1, computing devices 110 may be in communication with various systems of vehicle 100, such as deceleration system 160, acceleration system 162, steering system 164, signaling system 166, routing system 168, positioning system 170, perception system 172, and power system 174 (i.e. the vehicle's engine or motor) in order to control the movement, speed, etc. of vehicle 100 in accordance with the instructions 134 of memory 130. Again, although these systems are shown as external to computing devices 110, in actuality, these systems may also be incorporated into computing devices 110, again as an autonomous driving computing system for controlling vehicle 100.

As an example, computing devices 110 may interact with one or more actuators of the deceleration system 160 and/or acceleration system 162, such as brakes, accelerator pedal, and/or the engine or motor of the vehicle, in order to control the speed of the vehicle. Similarly, one or more actuators of the steering system 164, such as a steering wheel, steering shaft, and/or pinion and rack in a rack and pinion system, may be used by computing devices 110 in order to control the direction of vehicle 100. For example, if vehicle 100 is configured for use on a road, such as a car or truck, the steering system may include one or more actuators to control the angle of wheels to turn the vehicle. Signaling system 166 may be used by computing devices 110 in order to signal the vehicle's intent to other drivers or vehicles, for example, by lighting turn signals or brake lights when needed.

Routing system 168 may be used by computing devices 110 in order to determine and follow a route to a location. In this regard, the routing system 168 and/or data 132 may store detailed map information, e.g., highly detailed maps identifying the shape and elevation of roadways, lane lines, intersections, crosswalks, speed limits, traffic signals, buildings, signs, real time traffic information, vegetation, or other such objects and information.

Figure 2:
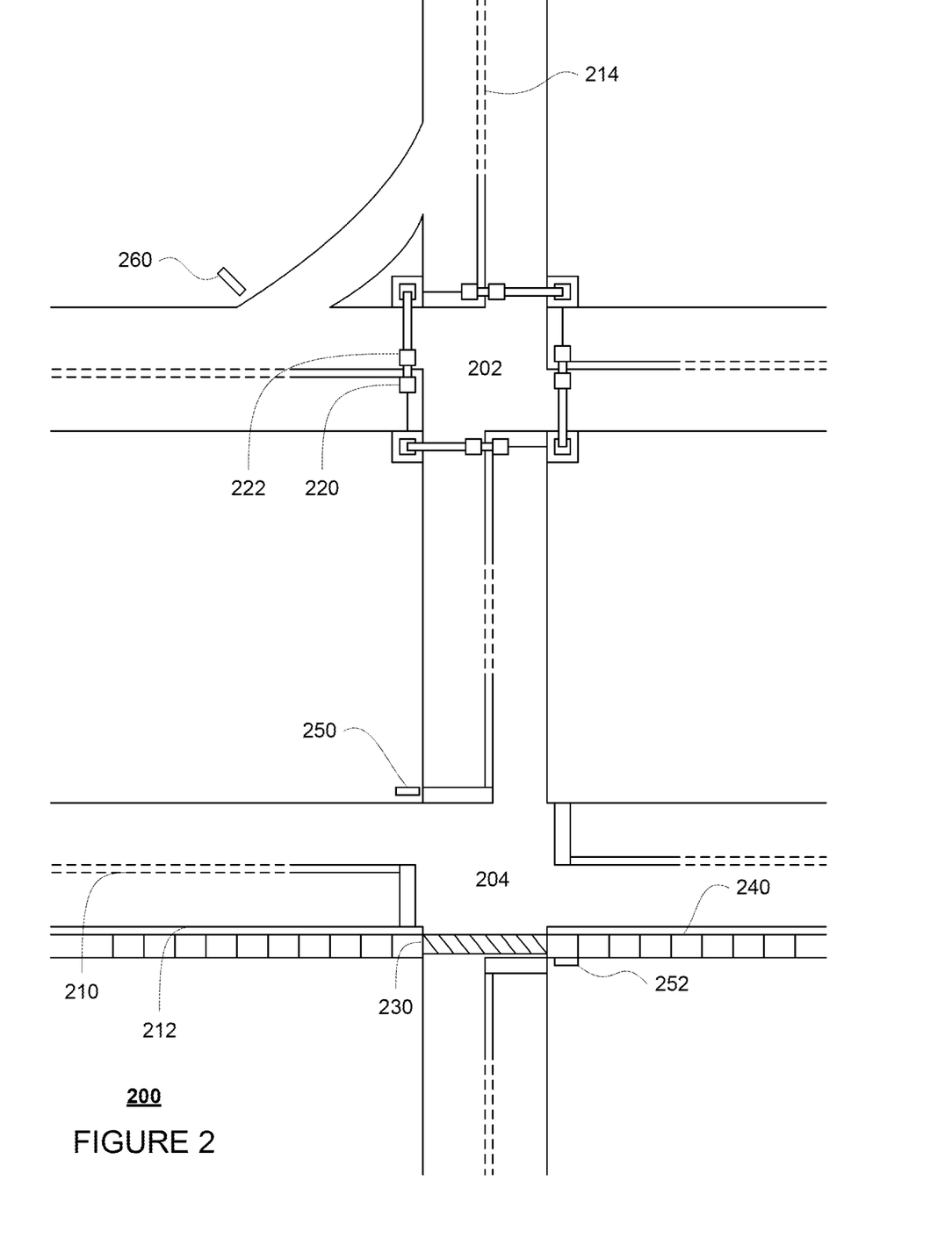
FIG. 2 is an example of map information in accordance with aspects of the disclosure.

FIG. 2 is an example of map information 200 for a section of roadway including intersections 202, 204. In this example, the map information 200 includes information identifying the shape, location, and other characteristics of lane lines 210, 212, 214, traffic signal lights 220, 222, crosswalk 230, sidewalks 240, stop signs 250, 252, and yield sign 260. Although the map information is depicted herein as an image-based map, the map information need not be entirely image based (for example, raster). For example, the map information may include one or more roadgraphs or graph networks of information such as roads, lanes, intersections, and the connections between these features. Each feature may be stored as graph data and may be associated with information such as a geographic location and whether or not it is linked to other related features, for example, a stop sign may be linked to a road and an intersection, etc. In some examples, the associated data may include grid-based indices of a roadgraph to allow for efficient lookup of certain roadgraph features.

Positioning system 170 may be used by computing devices 110 in order to determine the vehicle's relative or absolute position on a map or on the earth. For example, the position system 170 may include a GPS receiver to determine the device's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise that absolute geographical location.

The positioning system 170 may also include other devices in communication with computing devices 110, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing devices 110, other computing devices and combinations of the foregoing.

Figure 3:
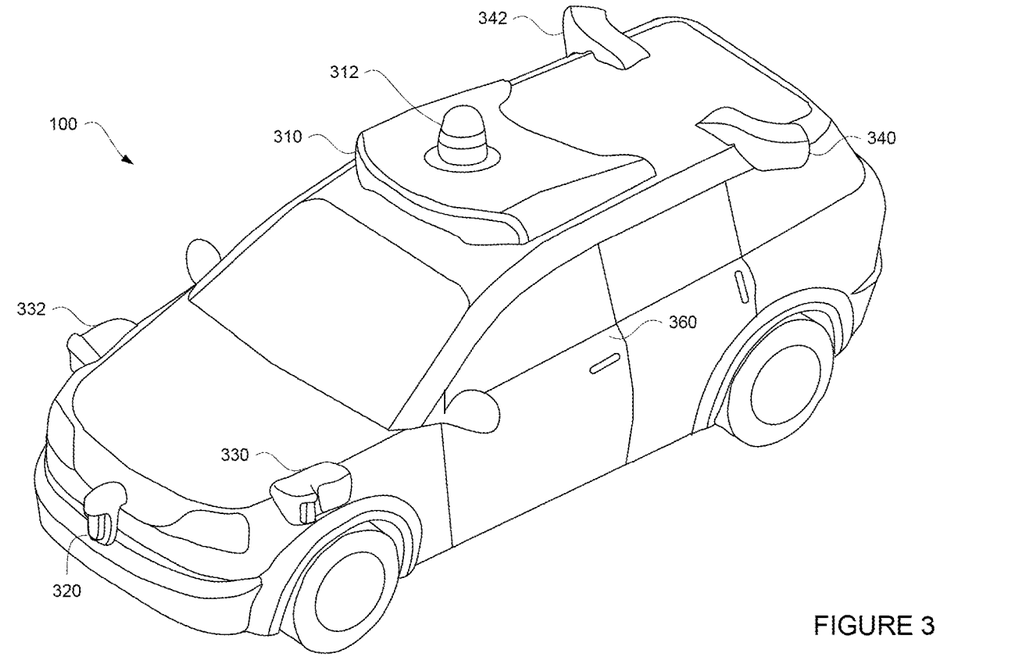
FIG. 3 is an example external view of a vehicle in accordance with aspects of the disclosure.

The perception system 172 also includes one or more components for detecting objects external to the vehicle such as other vehicles, obstacles in the roadway, traffic signals, signs, trees, etc. For example, the perception system 172 may include lasers, sonar, radar, cameras and/or any other detection devices that record data which may be processed by computing device 110. In the case where the vehicle is a passenger vehicle such as a minivan, the minivan may include a laser or other sensors mounted on the roof or other convenient location. For instance, FIG. 3 is an example external view of vehicle 100. In this example, roof-top housing 310 and dome housing 312 may include a LIDAR sensor as well as various cameras and radar units. In addition, housing 320 located at the front end of vehicle 100 and housings 330, 332 on the driver's and passenger's sides of the vehicle may each store a LIDAR sensor. For example, housing 330 is located in front of driver door 360. Vehicle

100 also includes housings 340, 342 for radar units and/or cameras also located on the roof of vehicle 100. Additional radar units and cameras (not shown) may be located at the front and rear ends of vehicle 100 and/or on other positions along the roof or roof-top housing 310.

The computing devices 110 may control the direction and speed of the vehicle by controlling various components. By way of example, computing devices 110 may navigate the vehicle to a destination location completely autonomously using data from the detailed map information and routing system 168. Computing devices 110 may use the positioning system 170 to determine the vehicle's location and perception system 172 to detect and respond to objects when needed to reach the location safely. In order to do so, computing devices 110 may cause the vehicle to accelerate (e.g., by increasing fuel or other energy provided to the engine by acceleration system 162), decelerate (e.g., by decreasing the fuel supplied to the engine, changing gears, and/or by applying brakes by deceleration system 160), change direction (e.g., by turning the front or rear wheels of vehicle 100 by steering system 164), and signal such changes (e.g., by lighting turn signals of signaling system 166). Thus, the acceleration system 162 and deceleration system 160 may be a part of a drivetrain that includes various components between an engine of the vehicle and the wheels of the vehicle. Again, by controlling these systems, computing devices 110 may also control the drivetrain of the vehicle in order to maneuver the vehicle autonomously.

Figure 4:
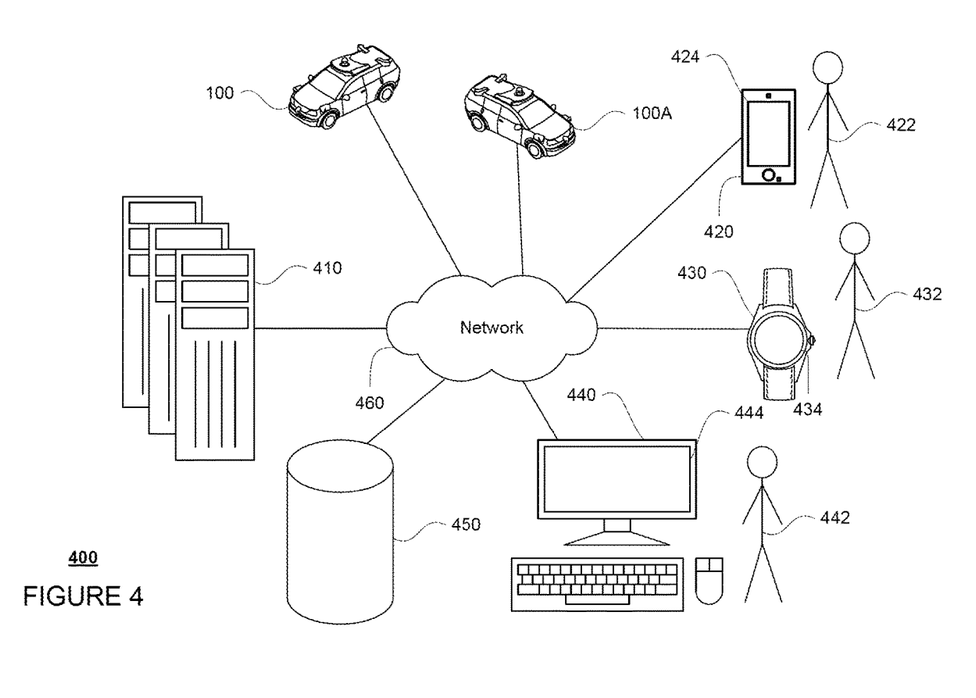
FIG. 4 is a pictorial diagram of an example system in accordance with aspects of the disclosure.
Figure 5:
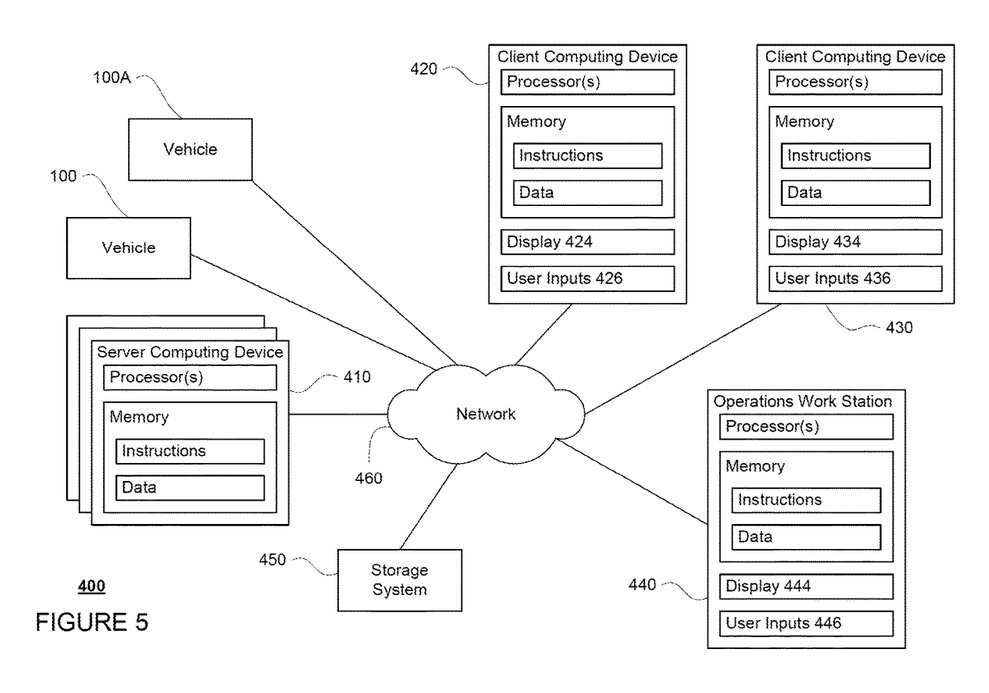
FIG. 5 is a functional diagram of the system of FIG. 4 in accordance with aspects of the disclosure.

Computing device 110 of vehicle 100 may also receive or transfer information to and from other computing devices, such as those computing devices that are a part of the transportation service as well as other computing devices. FIGS. 4 and 5 are pictorial and functional diagrams, respectively, of an example system 400 that includes a plurality of computing devices 410, 420, 430, 440 and a storage system 450 connected via a network 460. System 400 also includes vehicle 100, and vehicles 100A, 100B which may be configured the same as or similarly to vehicle 100. Although only a few vehicles and computing devices are depicted for simplicity, a typical system may include significantly more.

As shown in FIG. 4, each of computing devices 410, 420, 430, 440 may include one or more processors, memory, data and instructions. Such processors, memories, data and instructions may be configured similarly to one or more processors 120, memory 130, data 132, and instructions 134 of computing device 110.

The network 460, and intervening nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing devices 410 may include one or more server computing devices having a plurality of computing devices, e.g., a load balanced server farm, that exchange information with different nodes of a network for the purpose of receiving, processing and transmitting the data to and from other computing devices. For instance, one or more computing devices 410 may include one or more server computing devices that are capable of communicating with computing device 110 of vehicle 100 or a similar computing device of vehicle 100A as well as computing devices 420, 430, 440 via the network 460. For example, vehicles 100, 100A, may be a part of a fleet of vehicles that can be dispatched by server computing devices to various locations. In this regard, the server computing devices 410 may function as a validation computing system which can be used to validate autonomous control software which vehicles such as vehicle 100 and vehicle 100A may use to operate in an autonomous driving mode. In addition, server computing devices 410 may use network 460 to transmit and present information to a user, such as user 422, 432, 442 on a display, such as displays 424, 434, 444 of computing devices 420, 430, 440. In this regard, computing devices 420, 430, 440 may be considered client computing devices.

As shown in FIG. 4, each client computing device 420, 430, 440 may be a personal computing device intended for use by a user 422, 432, 442, and have all of the components normally used in connection with a personal computing device including a one or more processors (e.g., a central processing unit (CPU)), memory (e.g., RAM and internal hard drives) storing data and instructions, a display such as displays 424, 434, 444 (e.g., a monitor having a screen, a touch-screen, a projector, a television, or other device that is operable to display information), and user input devices 426, 436, 446 (e.g., a mouse, keyboard, touchscreen or microphone). The client computing devices may also include a camera for recording video streams, speakers, a network interface device, and all of the components used for connecting these elements to one another.

Although the client computing devices 420, 430, and 440 may each comprise a full-sized personal computing device, they may alternatively comprise mobile computing devices capable of wirelessly exchanging data with a server over a network such as the Internet. By way of example only, client computing device 420 may be a mobile phone or a device such as a wireless-enabled PDA, a tablet PC, a wearable computing device or system, or a netbook that is capable of obtaining information via the Internet or other networks. In another example, client computing device 430 may be a wearable computing system, shown as a wristwatch as shown in FIG. 4. As an example the user may input information using a small keyboard, a keypad, microphone, using visual signals with a camera, or a touch screen.

In some examples, client computing device 440 may be an operations workstation used by an administrator or operator to review scenario outcomes, handover times, and validation information as discussed further below. Although only a single operations workstation 440 is shown in FIGS. 4 and 5, any number of such work stations may be included in a typical system. Moreover, although operations work station is depicted as a desktop computer, operations works stations may include various types of personal computing devices such as laptops, netbooks, tablet computers, etc.

As with memory 130, storage system 450 can be of any type of computerized storage capable of storing information accessible by the server computing devices 410, such as a hard-drive, memory card, ROM, RAM, DVD, CD-ROM, write-capable, and read-only memories. In addition, storage system 450 may include a distributed storage system where data is stored on a plurality of different storage devices which may be physically located at the same or different geographic locations. Storage system 450 may be connected to the computing devices via the network 460 as shown in FIGS. 4 and 5, and/or may be directly connected to or incorporated into any of the computing devices 110, 410, 420, 430, 440, etc.

Storage system 450 may store various types of information as described in more detail below. This information may be retrieved or otherwise accessed by a server computing device, such as one or more server computing devices 410, in order to perform some or all of the features described herein. For instance, storage system 450 may store log data. This log data may include, for instance, sensor data generated by a perception system, such as perception system 172 of vehicle 100. As an example, the sensor data may include raw sensor data as well as data identifying defining characteristics of perceived objects such as shape, location, orientation, speed, etc. of objects such as vehicles, pedestrians, bicyclists, vegetation, curbs, lane lines, sidewalks, crosswalks, buildings, etc. The log data may also include "event" data identifying different types of events such as collisions or near collisions with other objects, planned trajectories describing a planned geometry and/or speed for a potential path of the vehicle 100, 100A, actual locations of the vehicles at different times, actual orientations/headings of the vehicle at different times, actual speeds, accelerations and decelerations of the vehicle at different times, classifications of and responses to perceived objects, behavior predictions of perceived objects, status of various systems (such as acceleration, deceleration, perception, steering, signaling, routing, power, etc.) of the vehicle at different times including logged errors, inputs to and outputs of the various systems of the vehicle at different times, etc. As such, these events and the sensor data may be used to "recreate" the vehicle's environment, including perceived objects, and behavior of a vehicle in a simulation. In some instances, the log data may be annotated with information identifying behaviors of the autonomous vehicle, such as passing, changing lanes, merging, etc., as well as with information identifying behaviors of other agents in the log data, such as passing or overtaking the autonomous vehicle, changing lanes, merging, etc.

The storage system may also store interactive agents, or data and instructions that can be used to generate a simulated road user in order to interact with a virtual vehicle in a simulation. Because there are different types of road users, there may be different types of interactive agents. For instance, there may be interactive agents for vehicles (or to specific types of vehicles, such as an autonomous vehicle, bus, van, small car, truck, motorcycle, emergency vehicles (e.g. police car, ambulance, etc.), and other larger vehicles as well as non-vehicles such as pedestrians, crowds of pedestrian, pedestrians with strollers, children, scooters, wild animals and pets, etc. Because humans are generally unpredictable, the models may be generated by establishing a set of characteristics. These may relate to the reaction times, for instance for reacting to visual or audible stimuli by moving a foot or a hand to change braking, acceleration, and/or steering behaviors of a vehicle as with a human driver, pedestrian, bicyclist. In other words, the model may include models for how an ideal, average, or below average human would brake or swerve which are available from existing human reaction research. In this regard, the models may be approximate and hand tuned, and likely to respond in more predictable ways than typical human drivers. In some instances, the models may also have behavioral rules, such as how a typical driver would behave at a 4-way stop or respond to a child in the environment, etc.

In addition, the storage system 450 may also store autonomous control software which is to be used by vehicles, such as vehicle 100, to operate a vehicle in an autonomous driving mode. This autonomous control software stored in the storage system 450 may be a version which has not yet been tested or validated. Once validated, the autonomous control software may be sent, for instance, to memory 130 of vehicle 100 in order to be used by computing devices 110 to control vehicle 100 in an autonomous driving mode.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

In order to test and/or validate the autonomous control software which will be stored in memory 130 for use by the computing devices 110 of vehicle 100, the server computing devices 410 may run various simulations. These simulations may be log based simulations that are generated from the information stored in the aforementioned log data of storage system 450. In this regard, the server computing devices 410 may access the storage system 450 in order to retrieve the log data and run a simulation. For instance, a portion of the log data corresponding to a minute in real time of an autonomous vehicle that generated the log data may be retrieved from the storage system. This portion of log data may be "hand" selected by human operators and/or computing devices based on the types of events recorded in the logs or more randomly, for instance, by selecting 1% or more or less of all autonomous driving logs.

As noted above, when running simulations using log data, there may be a limited number of situations having certain characteristics. For instance, there may be a need to test the software in "outlier" cases for which there may be very few examples. As an example, testing software in situations with specific types of road users, such as motorcyclists, may be difficult as there may be very few examples of motorcycles near a vehicle that recorded the log data. Because of this, certain behaviors that the software may be capable of causing a vehicle to perform, such as changing lanes or merging near, may not be sufficiently tested in order to confidently use these behaviors near a motorcycle. As a result, validating the safety and effectiveness of the vehicle's software for such situations may be very difficult. To address these issues, when running simulations, more common road users or agents may be replaced by less common road users. Examples of such less common road users may include, for example, autonomous vehicles, motorcyclists, bicyclists, emergency vehicles, trucks, or other larger vehicles. Other non-vehicle examples of less common road users may include, for example, pedestrians, crowds of pedestrian, pedestrians with strollers, children, scooters, wild animals and pets, etc.

Figure 6:
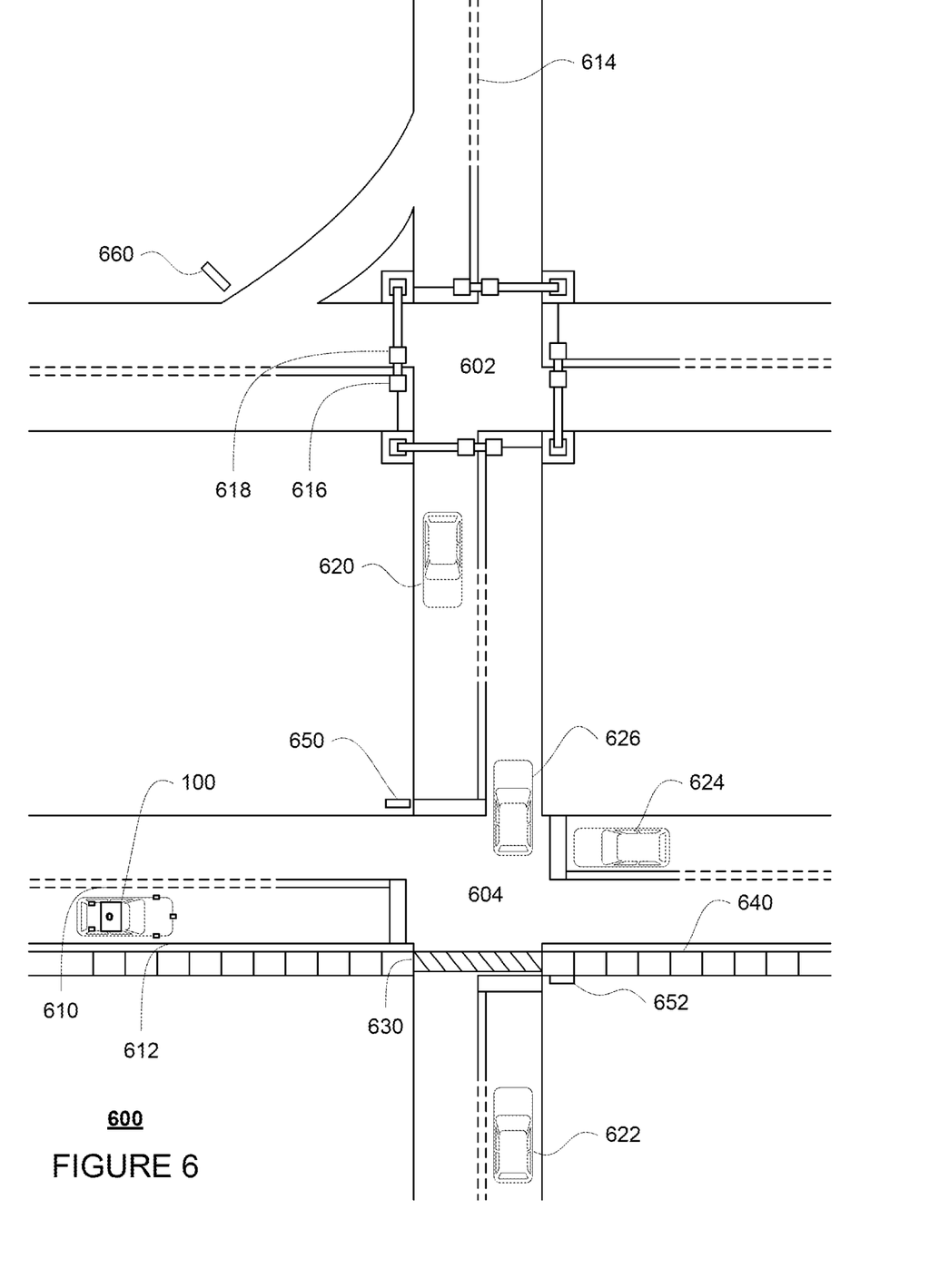
FIG. 6 is an example representation of log data in accordance with aspects of the disclosure.

In order to identify relevant log data, the log data of the storage system 450 may be analyzed to identify situations in which the autonomous vehicle is exhibiting one or more specific types of behaviors and another agent is exhibiting one or more specific types of behaviors. For instance, as noted above, the log data may be annotated with information identifying behaviors of the autonomous vehicle, such as passing, changing lanes, merging, etc., as well as with information identifying behaviors of other agents in the log data, such as passing or overtaking the autonomous vehicle, changing lanes, merging, etc. As an example, using this identifying information, log data for situations in which an autonomous vehicle wants to make a lane change and another object (in the same or a different lane as the autonomous vehicle) that wants to pass the autonomous vehicle may be identified or other situations in which an object cut into the lane in front of, to the side of, or behind the autonomous vehicle, unprotected turns (left, right, u-turns, etc.), etc. Other situations for other types of objects, such as a pedestrian in a crosswalk which could be turned into a crowd of people in and beyond the crosswalk, may also be useful As one example, log data where an agent not stopping at a stop sign at an intersection and an autonomous vehicle is making a left turn may be identified. Turning to FIG. 6 provides an example of log data 600 for a section of roadway corresponding to the map information 200. In this example, intersections 602 and 604 correspond to intersections 202 and 204, respectively. In this regard, the shape, location, and other characteristics of lane lines 210, 612, 614, traffic signal lights 616, 616, crosswalk 630, sidewalks 640, stop signs 650, 652, and yield sign 660 corresponds to the shape, location and other characteristics of lane lines 210, 212, 214, traffic signal lights 220, 222, crosswalk 230, sidewalks 240, stop signs 250, 252, and yield sign 260. In the log data 600, vehicle 100, is approaching an intersection 604, for instance, in order to make a left turn. Agent vehicles 620, 622, 624, 626, generated from sensor data and/or event data from the log data for the simulation, are also approaching or passing through intersection 604. In this example, the log data may indicate that the vehicle 620 (depicted as a car) does not stop at the stop sign 650, and thus, this log data may be identified. Of course, any number of other types of simulations may be identified depending upon what types of situations a human operator is interested in using to use for testing purposes. As another example, log data where the autonomous vehicle is making an unprotected turn (e.g. an unprotected left turn) and an agent is speeding (i.e. exceeding a posted speed limit for the lane in which the second vehicle is traveling) while approaching the autonomous vehicle from an oncoming lane (e.g. opposing traffic).

Figure 9:
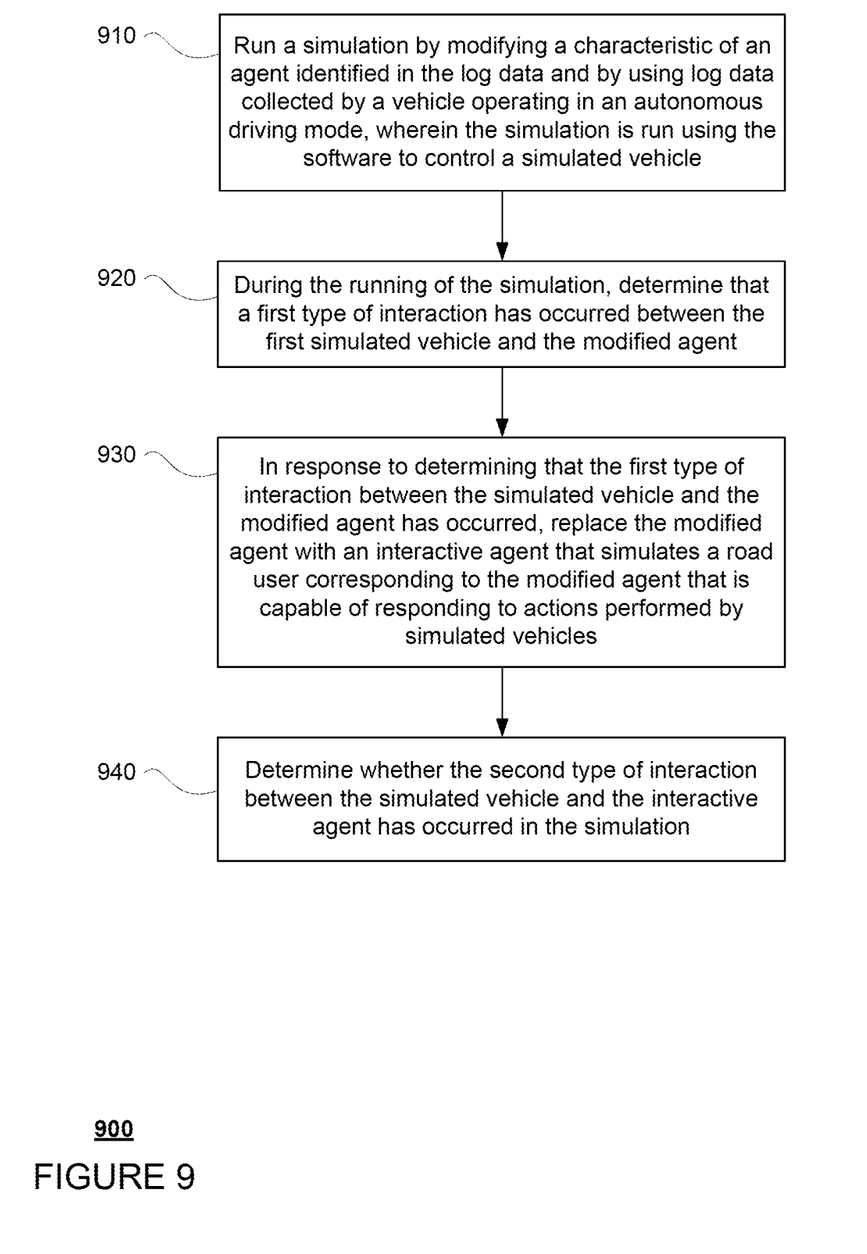
FIG. 9 is an example flow diagram in accordance with aspects of the disclosure.

FIG. 9 includes an example flow diagram 900 of some of the examples for testing software for controlling a vehicle in an autonomous driving mode, which may be performed by one or more processors such as processors of computing devices 410. For instance, at block 910, a simulation is run by modifying a characteristic of an agent identified in the log data and by using log data collected by a vehicle operating in an autonomous driving mode. In this example, the simulation is run using the software to control a simulated vehicle. For instance, using the identified log data, a simulation may be run. The retrieved portion of log data may be used to run an initial simulation. When running the autonomous control software through the portion of log data, the details (sensor data and events) of the log data may be used to generate a simulation. In other words, the sensor data of the portion of log data may simply be "played" as input to the perception system 172 of a simulated vehicle controlled by the autonomous control software. In this regard, the autonomous control software "experiences" or processes the log data as if the autonomous control software was actually being run on vehicle 100. In other words, the simulation may include data defining characteristics of objects such as shape, location, orientation, speed, etc. of objects such as vehicles, pedestrians, bicyclists, vegetation, curbs, lane lines, sidewalks, crosswalks, buildings, etc. defined by the sensor data of the log data. Further, the simulation may include characteristics for a virtual vehicle, corresponding to vehicle 100, including the virtual vehicle's shape, location, orientation, speed, etc. defined by the events of the log data.

However, in this simulation, the agent that is attempting the specific type of behavior for which the log data was identified may be modified in order to provide a modified simulation. For instance, the characteristics of the agent, such as the agent's size (e.g. dimensions) and shape may be adjusted in order to make the agent appear more like a particular type of agent to the simulated vehicle (or rather, to the software being used in the simulation). In other words, the software will "perceive" the modified agent as if it were a different type of agent. This may involve generating sensor data for the modified agent and providing this sensor data to the software. For example, a vehicle may be modified to look more like another vehicle such as a particular type of autonomous vehicle, bus, van, small car, truck, motorcycle, emergency vehicle (e.g. police car, ambulance, etc.), or other larger vehicles as well as non-vehicles such as pedestrians, crowds of pedestrians, pedestrians with strollers, children, scooters, wild animals and pets, etc. In still other examples, a vehicle such as a car may be may be modified to appear to be a truck having particular size and/or shape characteristics (e.g. a dump truck, garbage truck, tractor-trailer, etc.), a pedestrian may be modified to appear to be a bicyclist, a bicyclist may be modified to appear to be a scooter rider, a pedestrian with a shopping cart may be modified to appear to be a pedestrian with a stroller, and so on.

Figure 7:
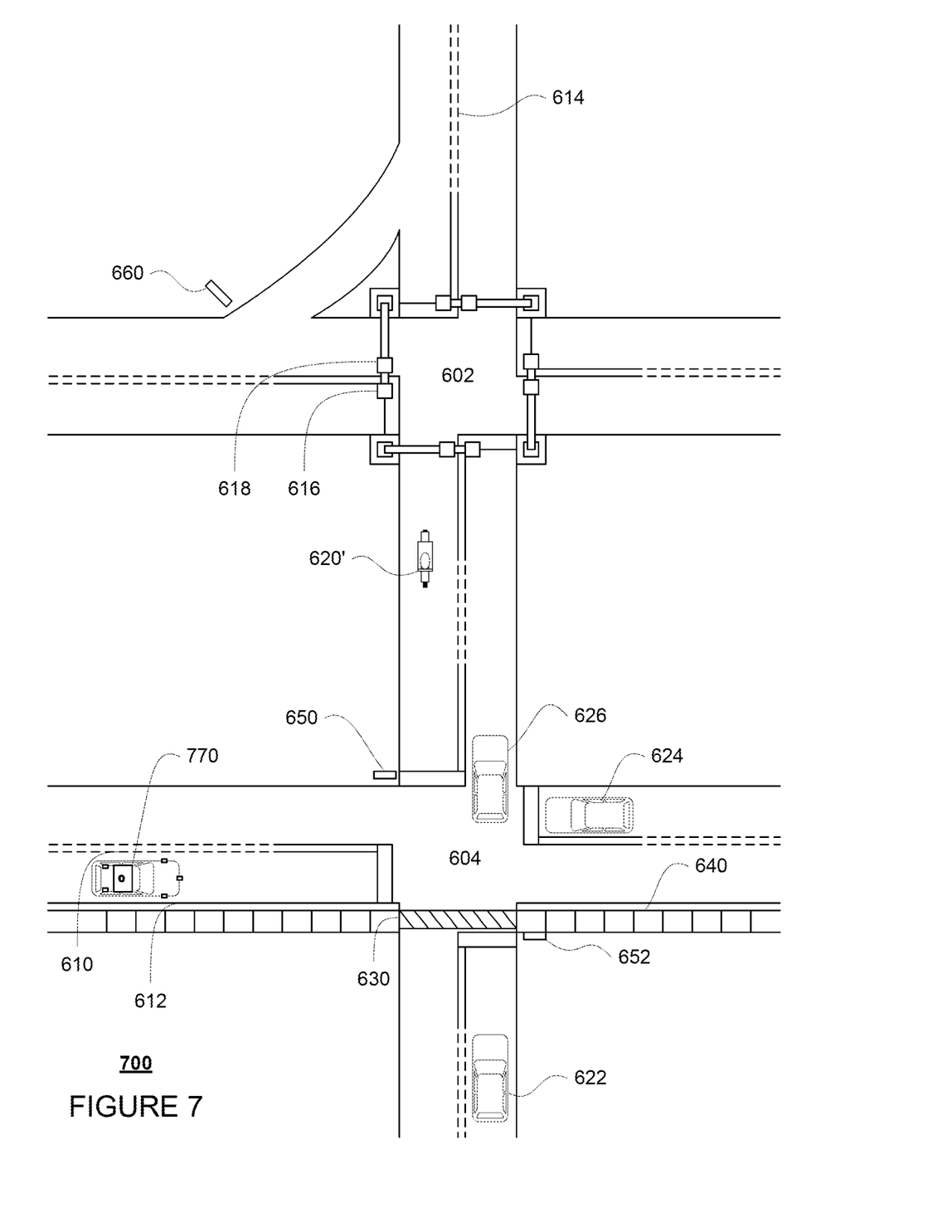
FIG. 7 is a further example representation of a simulation in accordance with aspects of the disclosure.

FIG. 7 provides an example of a simulation 700 run using a modified version of the log data of example 600. In this example, a simulated vehicle 770 may correspond to vehicle 100 or vehicle 100A and may use the software of the storage system 450 to determine how the simulated vehicle will behave in the simulation. In addition, the vehicle 620 is replaced by a modified agent 620'. In this example, the size and shape of the vehicle 620 are modified in order to cause the modified agent 620' to appear to be a motorcyclist exhibiting the behavior of the vehicle 620. Of course, as noted above, modified agent may correspond to any number of different types of road users such an autonomous vehicle, bus, van, small car, truck, motorcycle, emergency vehicles (e.g. police car, ambulance, etc.), and other larger vehicles as well as non-vehicles such as pedestrians, crowds of pedestrian, pedestrians with strollers, children, scooters, wild animals and pets, etc.

During the modified simulation, the server computing devices 410 may determine whether there would be a trigger for replacement of the modified agent with an interactive agent of the storage system 450. A trigger for replacement of the modified agent may include a certain type of interaction between the simulated vehicle and the modified agent. Returning to FIG. 9, at block 920, during the running of the simulation, determined that a first type of interaction will occur between the first simulated vehicle and the modified agent. Thereafter, at block 930, in response to determining that the first type of interaction between the simulated vehicle and the modified agent will occur, the modified agent is replaced with an interactive agent that simulates a road user corresponding to the modified agent that is capable of responding to actions performed by simulated vehicles.

For instance, the first type of interaction may include a collision or near collision. In other words, if there would be a collision (or near collision) between the autonomous vehicle (or rather the simulated vehicle) and the modified agent, this may be a trigger for replacing the modified agent with an interactive agent of the storage system 450. This may be done by looking at the position and orientation of the simulated vehicle 770 as well as that of the modified agent 620' and extrapolating whether these objects would intersect with one another at some point during the simulation. For example, this may include calculating whether given a trajectory of the modified agent and a trajectory generated by the software for the vehicle will intersect (or be within a small distance—i.e. near) with one another. If not, the simulation would be run without replacing the modified agent with an interactive agent.

Figure 8:
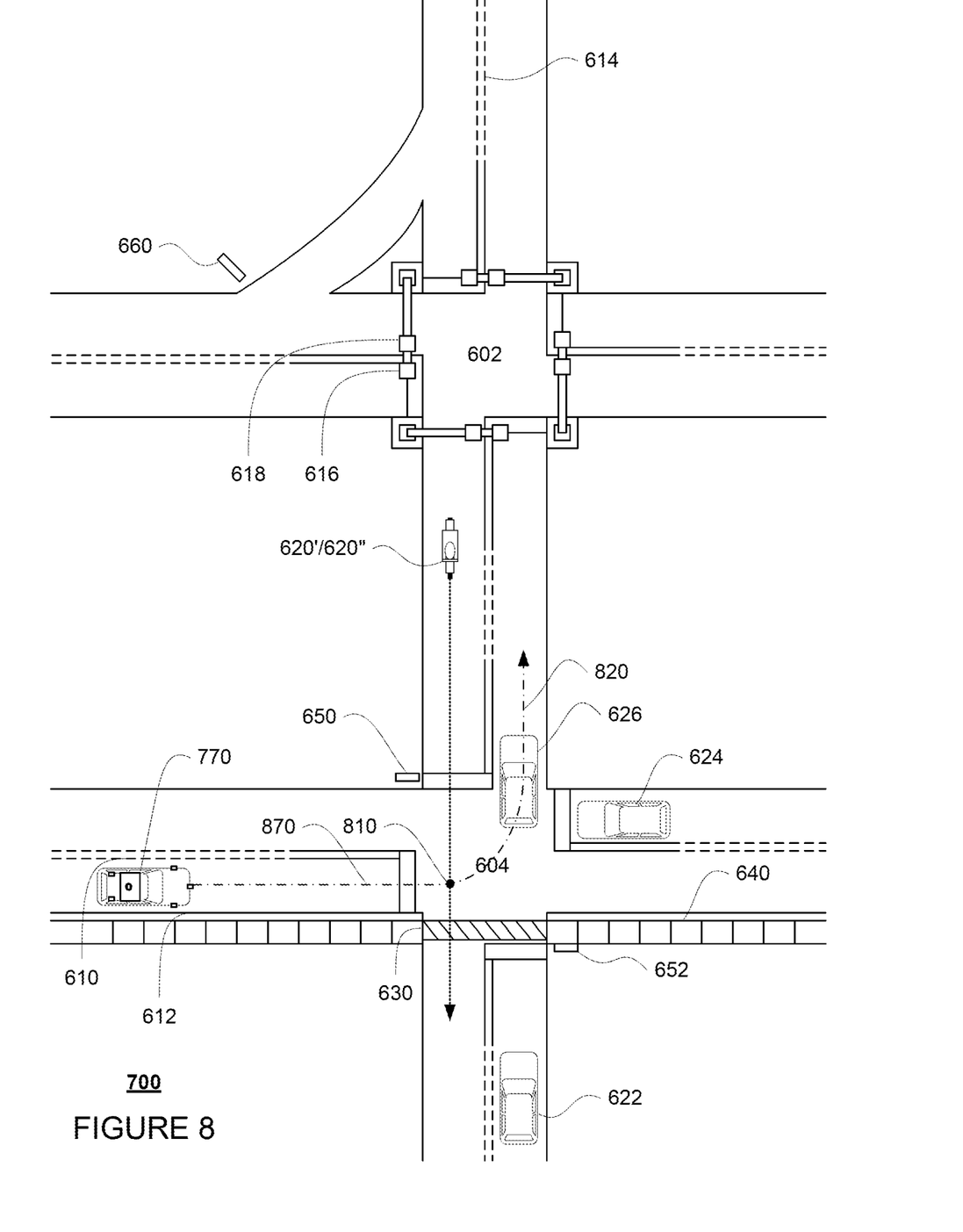
FIG. 8 is another example representation of a simulation and data in accordance with aspects of the disclosure.

Again, if there would be a collision or near collision in the simulation, the modified agent may be replaced by the server computing devices 410 with an agent that has some responsive capabilities (e.g. an interactive agent). As such, the interactive agent may be able to respond to the simulated vehicle's (e.g. vehicle 770's) behavior in the simulation. FIG. 8 represents a comparison of trajectories for the simulation 700. In this example, a trajectory 820 of the modified agent intersects with a trajectory generated by the software for the vehicle 870 at point 810. As such, the server computing devices 410 may automatically replace the modified agent 620' with an interactive agent 620" and continue the simulation. In this regard, the replacement occurs during the simulation. In addition, the interactive agent will have the physical and other characteristics of the modified agent, but the interactive agent 620" may now be able to respond to the simulated vehicle 770's behavior in the simulation.

In some instances, the interactive agent may be given certain characteristics by the server computing devices 410, such as increased or decreased aggressiveness. As an example, a interactive agent which is more aggressive may be more likely to get closer to the autonomous vehicle or change lanes in shorter periods of time than less aggressive interactive agents. In this regard, many different simulations may be run with different levels of aggressiveness for the interactive agent. As a result, from the log data for a single simulation, a plurality of different types of simulations may be created. In addition, because the interactive agent is already an adjusted agent, situations which would otherwise be rare in the logged data may be generated for testing the software.

In some instances, when running a simulation or a modified simulation, all of the agents in the log data may be replaced with interactive agents by the server computing devices 410. For instance, referring to the simulation 700, in addition to the modified agent 620' all of agent vehicles 622, 624, and 626 may be replaced by interactive agents from storage system 450. However, in such cases, because the interactive agents may be perfectly perceived (i.e. have sharp, clear edges and boundaries) by the simulated vehicle, certain issues with the software's perception system (i.e. the software corresponding to perception system 172) may be missed. In addition, using more of the data from the log data is likely to have higher fidelity to reality than using less. In other words, aggressive drivers may become more polite or vice versa depending on the interactive agent. As such, to make the simulations as realistic as possible, other approaches may be used.

The results of the simulation may be analyzed by the server computing devices 410 to identify whether particular types of interaction have occurred. In this regard, the server computing devices may be able to determine whether the software is able to complete the simulation without a particular type of interaction between the simulated vehicle and the interactive agent having occurred. Turning to block 940 of FIG. 9, whether a second type of interaction between the simulated vehicle and the interactive agent has occurred during the simulation is determined. For instance, the particular type of action may include collisions or near collisions between the simulated vehicle and the interactive agent as well as specific types of maneuvers (e.g. swerving, hard braking or a particular rate of deceleration, risky behaviors by the simulated vehicle that cause the interactive agent to swerve or brake hard, risky behaviors by the interactive agent that cause the simulated vehicle to swerve or brake hard, etc.). If there are no collisions or near collisions, the software may be considered to have "passed" the modified simulation or may be considered to be validated for that specific modified simulation. If a collision or near collision with an agent is identified, this may indicate that the software would not complete the modified simulation without the collision or near collision having occurred. As such, the modified simulation may be annotated or flagged for additional consideration, etc. In addition or as an alternative to collisions or near collisions and other interactions, the simulation may be analyzed to review other metrics such as comfort, stranding, safety risk, etc. in order to evaluate the software.

Although the examples herein relate to modifying and replacing only one road user, the features described herein may be applicable to multiple road users within the same simulation. For instance, the log data of the storage system 450 may be analyzed to identify situations in which the autonomous vehicle is exhibiting one or more specific types of behaviors and two or more other agents are exhibiting one or more specific types of behaviors. As an example, the log data may be analyzed to identify situations in which the autonomous vehicle is making an unprotected left turn, a second vehicle approaching the autonomous vehicle from an oncoming lane is speeding (i.e. exceeding a posted speed limit for the lane in which the second vehicle is traveling) and a third vehicle (e.g. a truck) is blocking the autonomous vehicle's view of the second vehicle. One or both of the second and third vehicle may then be modified. For example, the second vehicle may be modified to appear to be a motorcycle and the third vehicle may be modified to appear to be an even larger truck, thus making the simulation more complicated. For any of those modified second and/or third vehicles which have a trajectory which intersects with a trajectory of the vehicle, those second and/or third vehicles may be replaced with interactive agents as described above. As another example, the log data may be analyzed to identify situations in which the autonomous vehicle is approaching a plurality of jaywalking pedestrians. When running a simulation, the jaywalking pedestrians may be modified to appear to be other road users such as bicyclists, scooter riders, animals or other types of road users capable of jaywalking. For any of those modified other road users which have a trajectory which intersects with a trajectory of the vehicle, those other road users may be replaced with interactive agents as described above.

Although the examples herein rely on simulations based on log data collected by a real vehicle, simulations may be generated from log data from a prior simulation, or possibly even a simulation that doesn't actually include such real-life driving data.

The features described herein may provide for a safe, effective, and realistic way of testing software for autonomous vehicles in order to identify potential critical bugs with the software for outlier situations. For instance, the software can be tested in hundreds of thousands of situations based on actual sensor data with modified agents. In addition, those simulations that are annotated or flagged may be more critically important to determining how to revise or update the software being tested. Further, by adding interactive agents, "new" simulations can be created which allow for analysis of a plurality of potential safety issues without requiring new log data for such simulations. Other benefits may include the ability of a software developer to experiment with behavior changes and use this to display lots of realistic examples of how their change plays out. This could allow for much faster feature development, since the alternatives would involve the developer sifting through lots of spurious failures themselves, waiting for an operator to do the same, or to drive a real vehicle around with the behavior change to log real responses.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method of testing software for operating a vehicle in an autonomous driving mode, the method comprising:
   retrieving, by one or more processors, log data collected by the vehicle while operating in the autonomous driving mode;
   generating, by the one or more processors, a modified version of the log data by modifying an agent identified by the log data;
   running, by the one or more processors, a first simulation based on the modified version of the log data using the software to control a simulated vehicle;
   during the running of the first simulation, determining, by the one or more processors, whether an interaction between the simulated vehicle and the modified agent has occurred; and
   in response to determining that the interaction between the simulated vehicle and the modified agent has occurred, running, by the one or more processors, a second simulation after replacing the modified agent with an interactive agent that simulates a road user corresponding to the modified agent that is capable of responding to actions performed by the simulated vehicle.

2. The method of claim 1, further comprising:
   during the running of the second simulation, determining, by the one or more processors, whether the interaction between the simulated vehicle and the interactive agent has occurred.

3. The method of claim 1, wherein the interaction includes swerving by the simulated vehicle.

4. The method of claim 1, wherein the interaction includes hard braking or a particular rate of deceleration by the simulated vehicle.

5. The method of claim 1, wherein the interaction includes risky behaviors by the simulated vehicle that cause the interactive agent to swerve.

6. The method of claim 1, wherein the interaction includes risky behaviors by the interactive agent that cause the simulated vehicle to brake hard.

7. The method of claim 1, wherein the interaction includes a collision or a near collision between the simulated vehicle and the interactive agent.

8. The method of claim 7, further comprising, in response to determining that the collision or the near collision between the simulated vehicle and the interactive agent has occurred, flagging the second simulation for further review.

9. The method of claim 1, further comprising identifying the log data by analyzing various log data to identify a situation in which the vehicle operating in the autonomous driving mode is exhibiting a first type of behavior and the agent is exhibiting a second type of behavior.

10. The method of claim 9, wherein the first type of behavior is changing lanes or making an unprotected turn.

11. The method of claim 10, wherein the second type of behavior is passing the vehicle operating in the autonomous driving mode.

12. The method of claim 10, wherein the second type of behavior is exceeding a speed limit for the agent while approaching the vehicle operating in the autonomous driving mode from an oncoming lane.

13. The method of claim 1, wherein a characteristic of the agent includes a dimension or a shape of the agent.

14. A system for testing software for operating a vehicle in an autonomous driving mode, the system comprising:
   one or more processors, wherein the one or more processors are configured to:
   retrieve log data collected by the vehicle while operating in the autonomous driving mode;
   generate a modified version of the log data by modifying an agent identified by the log data;
   run a first simulation based on the modified version of the log data using the software to control a simulated vehicle;
   during the running of the first simulation, determine whether an interaction between the simulated vehicle and the modified agent has occurred; and
   in response to determining that the interaction between the simulated vehicle and the modified agent has occurred, run a second simulation after replacing the modified agent with an interactive agent that simulates a road user corresponding to the modified agent that is capable of responding to actions performed by the simulated vehicle.

15. The system of claim 14, wherein the one or more processors are further configured to, during the running of the second simulation, determine whether the interaction between the simulated vehicle and the interactive agent has occurred.

16. The system of claim 14, wherein the interaction includes swerving by the simulated vehicle.

17. The system of claim 14, wherein the interaction includes hard braking or a particular rate of deceleration by the simulated vehicle.

18. The system of claim 14, wherein the interaction includes risky behaviors by the simulated vehicle that cause the interactive agent to swerve.

19. The system of claim 14, wherein the interaction includes risky behaviors by the interactive agent that cause the simulated vehicle to brake hard.

20. The system of claim 14, wherein the interaction includes a collision or a near collision between the simulated vehicle and the interactive agent.

* * * * *